(12) United States Patent
Khosravi et al.

(10) Patent No.: US 11,374,513 B2
(45) Date of Patent: Jun. 28, 2022

(54) MOTOR CONTROL CIRCUIT WITH DEGAUSS FILTER

(71) Applicant: Allegro MicroSystems, LLC, Manchester, NH (US)

(72) Inventors: Kamyar Khosravi, Manchester, NH (US); Masahira Kurihara, Prague (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 106 days.

(21) Appl. No.: 16/255,088

(22) Filed: Jan. 23, 2019

(65) Prior Publication Data

US 2020/0235682 A1 Jul. 23, 2020

(51) Int. Cl.
| | |
|---|---|
| H02P 6/06 | (2006.01) |
| H02P 6/182 | (2016.01) |
| H03K 5/24 | (2006.01) |
| H02M 7/5387 | (2007.01) |

(52) U.S. Cl.
CPC ............. *H02P 6/182* (2013.01); *H03K 5/24* (2013.01); *H02M 7/5387* (2013.01)

(58) Field of Classification Search
CPC .............................. H02P 6/182; H02M 7/5387
USPC ........................................................ 318/400.06
See application file for complete search history.

(56) References Cited

U.S. PATENT DOCUMENTS

| | | | |
|---|---|---|---|
| 4,743,815 A * | 5/1988 | Gee | H02P 6/153 318/400.11 |
| 5,457,364 A | 10/1995 | Bilotti et al. | |
| 5,471,122 A | 11/1995 | Bilotti et al. | |
| 5,708,578 A | 1/1998 | Stoddard et al. | |
| 7,590,334 B2 | 9/2009 | Yabusaki et al. | |
| 7,694,200 B2 | 4/2010 | Forrest et al. | |
| 7,936,144 B2 | 5/2011 | Vig et al. | |
| 8,084,969 B2 | 12/2011 | David et al. | |
| 8,093,844 B2 | 1/2012 | Milesi et al. | |
| 8,138,708 B2 | 3/2012 | Ward et al. | |
| 8,461,782 B2 | 6/2013 | Ward et al. | |
| 8,519,649 B2 * | 8/2013 | Taniguchi | H02P 6/20 318/400.02 |

(Continued)

OTHER PUBLICATIONS

U.S. Appl. No. 16/426,444, filed May 30, 2019, Gianluca Allegrini, et al.

(Continued)

*Primary Examiner* — Kawing Chan
*Assistant Examiner* — Gabriel Agared
(74) *Attorney, Agent, or Firm* — Daly, Crowley, Mofford & Durkee, LLP (57) ABSTRACT

A system for controlling a motor includes a motor having a plurality of phases, each phase comprising a coil having a first end coupled to a motor neutral point. A motor driver circuit is coupled to a second end of each coil to provide power to each coil. A motor controller circuit is coupled to the motor driver circuit to control the power that is provided to the motor. A comparator is coupled to compare a voltage at the motor neutral point to a voltage at the second end of each coil to detect a back-EMF polarity and produce a polarity signal representing the back-EMF polarity. A back-EMF filter circuit is coupled to receive the polarity signal and invert the polarity signal if the polarity signal does not match an expected value.

31 Claims, 4 Drawing Sheets

(56) References Cited

U.S. PATENT DOCUMENTS

| | | |
|---|---|---|
| 8,629,642 B2 | 1/2014 | Ward et al. |
| 8,633,745 B1 | 1/2014 | Peterson |
| 8,638,053 B2 | 1/2014 | Ng |
| 8,716,959 B2 | 5/2014 | David et al. |
| 8,729,841 B2 | 5/2014 | Reynolds et al. |
| 8,736,316 B2 | 5/2014 | Chaware et al. |
| 8,742,713 B2 | 6/2014 | Ng |
| 8,873,944 B2 | 10/2014 | Latham et al. |
| 8,917,043 B2 | 12/2014 | Reynolds et al. |
| 8,917,044 B2 | 12/2014 | Reynolds et al. |
| 8,970,265 B2 | 3/2015 | McIntosh et al. |
| 9,088,233 B2 | 7/2015 | Alcorn et al. |
| 9,172,320 B2 | 10/2015 | Reynolds et al. |
| 9,203,339 B2 | 12/2015 | Sato |
| 9,214,884 B2 | 12/2015 | Sonoda et al. |
| 9,281,769 B2 | 3/2016 | Reynolds et al. |
| 9,291,876 B2 | 3/2016 | Cadugan et al. |
| 9,294,084 B1 | 3/2016 | McIntosh et al. |
| 9,300,235 B2 | 3/2016 | Ng et al. |
| 9,496,708 B2 | 11/2016 | Chappell et al. |
| 9,584,059 B2 | 2/2017 | Reynolds et al. |
| 9,735,773 B2 | 8/2017 | McIntosh et al. |
| 9,780,706 B2 | 10/2017 | Allegrini et al. |
| 9,784,594 B2 | 10/2017 | David et al. |
| 9,843,285 B1 | 12/2017 | Lu |
| 9,887,653 B2 | 2/2018 | Ross et al. |
| 9,929,683 B2 | 3/2018 | Sonoda et al. |
| 9,935,452 B2 | 4/2018 | Looby et al. |
| 9,960,716 B2 | 5/2018 | Ambruson et al. |
| 10,084,407 B2 | 9/2018 | Looby et al. |
| 10,116,243 B2 | 10/2018 | Lu et al. |
| 10,181,810 B2 | 1/2019 | Lu et al. |
| 10,312,847 B2 | 6/2019 | Lu |
| 10,348,223 B1 | 7/2019 | Khosravi et al. |
| 2004/0080293 A1* | 4/2004 | Kurosawa ............... H02P 6/182 318/400.11 |
| 2005/0057210 A1* | 3/2005 | Ueda .................... H02M 5/458 318/801 |
| 2006/0082336 A1* | 4/2006 | Kurosawa ................ H02P 1/46 318/400.12 |
| 2009/0153086 A1* | 6/2009 | Narumi .................... H02P 6/18 318/400.35 |
| 2010/0102771 A1* | 4/2010 | Anderson ............... H02P 23/14 318/799 |
| 2011/0156622 A1* | 6/2011 | Galbiati .................. H02P 6/085 318/400.2 |
| 2011/0285337 A1* | 11/2011 | Taniguchi ............... H02P 27/08 318/400.34 |
| 2013/0049656 A1* | 2/2013 | Yasui ..................... H02P 21/00 318/400.02 |
| 2013/0106329 A1* | 5/2013 | Kato ....................... H02P 21/18 318/400.11 |
| 2014/0055064 A1 | 2/2014 | Ng |
| 2014/0217945 A1* | 8/2014 | Cahill ................... H02P 25/028 73/660 |
| 2018/0167011 A1 | 6/2018 | Lu et al. |
| 2018/0219500 A1* | 8/2018 | Wong ..................... H02P 6/182 |
| 2018/0367073 A1 | 12/2018 | Haas |
| 2020/0021212 A1* | 1/2020 | Yamada ................ H02P 27/085 |
| 2020/0028456 A1 | 1/2020 | Morioka et al. |

OTHER PUBLICATIONS

U.S. Appl. No. 16/365,855, filed Mar. 27, 2019, Steven Daubert, et al.
U.S. Appl. No. 16/396,877, filed Apr. 29, 2019, Yisong Lu.
U.S. Appl. No. 16/299,293, filed Mar. 12, 2019, Yisong Lu.
Allegro MicroSystems, LLC Data Sheet A4962; "Sensorless BLDC Controller;" Jan. 14, 2019; 42 pages.

\* cited by examiner

MOTOR CONTROL CIRCUIT WITH DEGAUSS FILTER

FIELD

This disclosure relates to motor controllers and, more particularly, to motor controllers with a selective degaussing filter.

BACKGROUND

Electric motors convert electrical energy into mechanical energy in many current-day applications. These include small motors used for precision control of robotic arms to large motors used to drive the wheels of the largest strip-mining dump trucks. In each case, a motor controller circuit controls the amount of power delivered to the motor.

Some electric motors have two or three phases. For these motors, the motor controller circuit may coordinate the delivery and timing of power to each of the phases to operate the motor based on the motor's rotational position and speed. In these cases, if the motor controller circuit that has information about the motor's position, it can operate the motor with greater precision and efficiency.

Sensored and sensorless motors detect the position of the motor in different ways. A sensored motor uses sensors that detect the motor's position and send the information to the motor control circuit. Sensorless motors may detect and/or measure a motor's (or a motor coil's) counter-electromotive (or "back-EMF") voltage—a voltage induced by the coil that acts against the applied voltage that causes the motor to spin.

SUMMARY

A motor and control system that more accurately detects the back-EMF voltage may be able to operate with greater efficiency and precision.

In an embodiment, a system includes: a motor having a plurality of phases, each phase comprising a coil having a first end coupled to a motor neutral point; a motor driver circuit coupled to a second end of each coil to provide power to each coil; a motor controller circuit coupled to the motor driver circuit to control the power that is provided to the motor; a comparator coupled to compare a voltage at the motor neutral point to a voltage at the second end of each coil to detect a back-EMF polarity and produce a polarity signal representing the back-EMF polarity; and a back-EMF filter circuit coupled to receive the polarity signal and invert the polarity signal if the polarity signal does not match an expected value.

One or more of the following features may be included.

The polarity signal may be a logic signal and the expected value is either a logic-high or logic-low value.

The plurality of phases may comprise exactly three phases.

The motor driver circuit may comprise a plurality of switches coupled to selectively provide power to and a return path from each coil.

The plurality of switches may be field-effect transistors.

The motor controller circuit may be coupled to each of the plurality of switches and configured to open and close each of the plurality of switches to provide the power to and the return path from each coil.

The motor controller circuit is configured to deactivate a respective coil while the comparator is comparing the voltage at the motor neutral point to the voltage at the second end of the respective coil.

The back-EMF filter circuit may be further configured to compare the polarity signal to the expected value.

The back-EMF filter circuit comprises a network of logic gates arranged to determine if the polarity signal does not match the expected value.

The back-EMF filter may be configured to determine if the polarity signal does not match the expected value after a predetermined blank time period.

The back-EMF filter circuit may be configured to stop inverting the polarity signal if a transition is detected on the polarity signal after a blank time period.

In another embodiment, a circuit for driving a motor comprises a comparator coupled to detect a value of a voltage across a motor coil and produce a polarity signal representing a polarity of a back-EMF signal from a motor; a back-EMF filter circuit coupled to receive the polarity signal and produce a filtered polarity signal by inverting the polarity signal if the polarity signal does not match an expected value; and a motor controller circuit coupled to receive the filtered polarity signal and provide power to the motor coil in response to the filtered polarity signal.

One or more of the following features may be included.

The polarity signal may be a logic signal and the expected value is either a logic-high or logic-low value.

The motor driver circuit may comprise one or more switches to selectively provide power to and a return path from the motor coil.

The one or more switches may be field-effect transistors.

The motor controller circuit may be configured to deactivate the motor coil while the comparator detects the value of the voltage across the motor coil.

The back-EMF filter circuit may be further configured to compare the polarity signal to the expected value.

The back-EMF filter circuit may comprise a network of logic gates arranged to determine if the polarity signal does not match the expected value.

The back-EMF filter circuit may be configured to determine if the polarity signal does not match the expected value after a predetermined blank time period.

The back-EMF filter circuit may be configured to stop inverting the polarity signal if a transition is detected on the polarity signal after a blank time period.

In another embodiment, a circuit for driving a motor comprises: a comparator coupled to detect a value of a voltage across a motor coil and produce a polarity signal representing a polarity of a back-EMF signal from the motor; means for filtering the polarity signal to produce a filtered polarity signal; and a motor controller circuit coupled to receive the filtered polarity signal and provide power to the motor coil in response to the filtered polarity signal.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the patent. Like numbers in the figures denote like elements.

DETAILED DESCRIPTION

Figures 1, 1A:
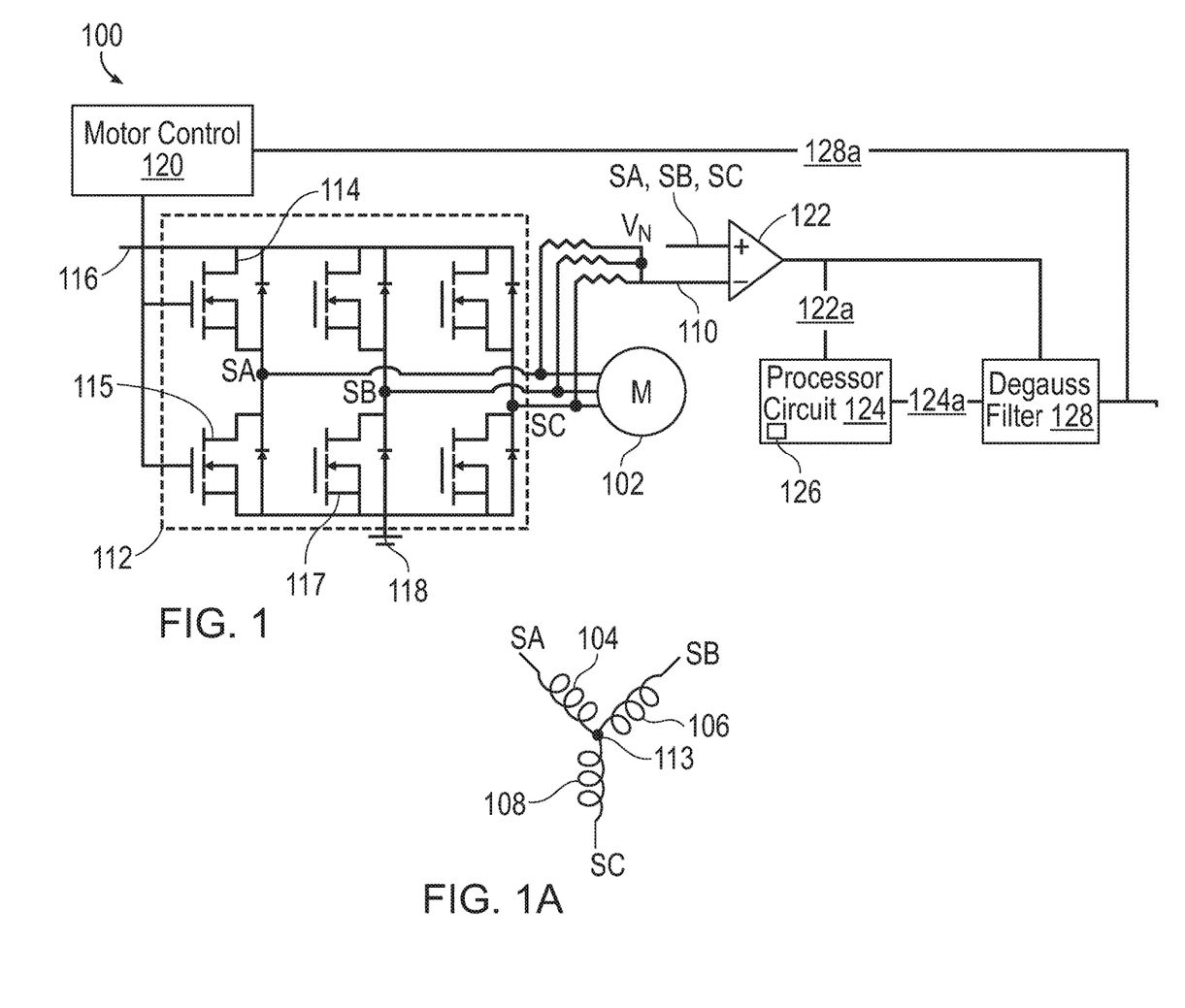
FIG. 1 is a block diagram of a motor control circuit.
FIG. 1A is a circuit diagram of motor coils and a comparator.

FIG. 1 is a block diagram of a system 100 that is configured to operate a motor 102. In the example shown, motor 102 is a three-phase brushless motor. Also, FIG. 1A is a diagram of the coils within motor 102. Each phase includes a coil (e.g. coils 104, 106, and 108) having two ends or terminals. One end is coupled to the node 113, which may be the neutral point of the motor. The other end (labeled SA, SB, and SC for the respective coils 104, 106, and 108) is coupled to motor driver circuit 112.

Motor driver circuit 112 includes pairs of switches (e.g. switch 114 and 115) coupled in parallel between power 116 and ground 118. In the example of FIG. 1, the switches 114, 115 are power field-effect transistors (FETs). Nodes SA, SB, and SC are formed between each pair of switches. These nodes are coupled to the ends of motor coils 104, 106, and 108 as shown in FIG. 1A.

The gate terminal of each FET switch is coupled to a motor controller circuit 120, which turns the switches on and off in a preordered sequence. In this way, motor control circuit 120 provides power to spin motor 102. For example, if FET switches 114 and 117 are closed (and the other FET switches are open) current can flow from power 116, through switch 114 to node SA, through coil 104, through coil 106, to node SB, and through switch 117 to ground 118. By selectively opening and closing the FET switches in this way, motor controller circuit 120 can provide power to all phases of motor 102 to spin the motor.

System 100 also includes a comparator circuit 122 that compares the voltage at each node SA, SB, and SC to the voltage at node 110. The voltage at node 110 may be the same as and/or may represent the voltage at the motor neutral point 113. Thus, the output signal 122a of comparator 122 represents the polarity of the voltage across a respective coil 104, 106, or 108.

Output signal 122a may be a bus where each line of the bus represents a voltage across a different coil, or output signal 122a may be time multiplexed so that, at one time, the output represents the voltage across coil 104, at another time, output signal 122a represents the voltage across coil 106, and at yet another time, output signal 122a represents the voltage across coil 108. Output signal 122a may also be a polarity signal that represents whether each coil is in a state where it is generating back-EMF voltage.

For example, while measuring coil 104, if the voltage from node 110 to node SA is positive (i.e. node SA has a higher voltage than node 110), then output signal 122a will be high (e.g. logic one). Conversely, if the voltage from node 110 to node SA is negative (i.e. node 110 has a higher voltage than node SA), then output signal 122a will be low (e.g. logic zero). In this case, when output signal 122a is high, it may indicate that coil 104 is generating a back-EMF voltage. Thus, voltage output signal 122a may be referred to as a polarity signal because it effectively indicates the polarity of the voltage across the motor coils. In other embodiments, the logic levels may be switched.

When the current flows to the motor coils, each node SA, SB, or SC may be coupled to power or ground. This may allow current to flow through the coils from power or to ground during the time that comparator 122 is measuring the voltage across the coil—in other words, at a time that the coil is not fully degaussed. However, this may result in a false positive that the coil is generating back-EMF voltage. For example, the current through the coil may produce a voltage which causes comparator 122 to drive signal 122a high at a time when the coil is not actually generating a back-EMF voltage.

As motor 102 rotates, back-EMF signal 122a may be constantly generated. In an embodiment, when back-EMF voltage (e.g. the voltage across a motor coil) is positive, the output of comparator 122 is expected to be high and when the back-EMF voltage is negative, the output of the comparator 122 is low. However, a degaussing effect of the motor coils can overshadow (e.g. override) this output voltage. For example, if the back-EMF voltage is negative, (e.g. signal 122a is expected to be low) but the degaussing effect forces it to go high (e.g. current flows from motor back to the supply), the degaussing effect may cause signal 122a to be high. Conversely if the back-EMF voltage is positive (e.g. signal 122a is expected to be high) but the degaussing filter forces it low, current may flow from ground 118 to the motor. This may cause signal 122a to be unexpectedly low. To correct these false signal levels, processor circuit 124 may check the back-EMF signal 122a level after a blank time and compare it to an expected value. If the level of back-EMF signal 122a does not match the expected value, then processor circuit 124 may activate degauss filter 128, as discussed below.

To compensate for false outputs on signal 122a, system 100 may include a processor circuit 124 that receives signal 122a. Processor circuit 124 may include custom analog and/or digital circuitry for detecting false outputs on signal 122a. In embodiments, processor circuit 124 may include a memory (which may be a RAM or ROM memory) that includes logic, software instructions, a logic table, or the like that can be used in detecting and compensating for false outputs on signal 122a.

System 100 may also include a degauss filter 128 that produces output signal 128a. In embodiments, degauss filter 128 may be referred to as a back-EMF filter circuit. Alternatively, degauss filter 128 and processor circuit 124 may be collectively referred to as a back-EMF filter circuit.

Degauss filter 128 may receive control signal 124a from processor circuit 124. In embodiments, degauss filter 128 may be an XOR gate. For example, when signal 124a is low, degauss filter 128 may pass signal 122a through so that signal 128a is the same as signal 122a, and when signal 124a is high, degauss filter 128 may invert signal 122a.

Like signal 122a, signal 128a may indicate whether a coil is generating a back-EMF voltage. However, processor circuit 124 and degauss filter 128 may reduce or prevent the occurrences of false outputs. Thus, signal 128a may include fewer (or zero) false outputs than signal 122a.

Filtered signal 128a is received by motor controller circuit 120 which may use it to determine how and when to open and close the FET switches of motor driver circuit 112.

Figure 2:
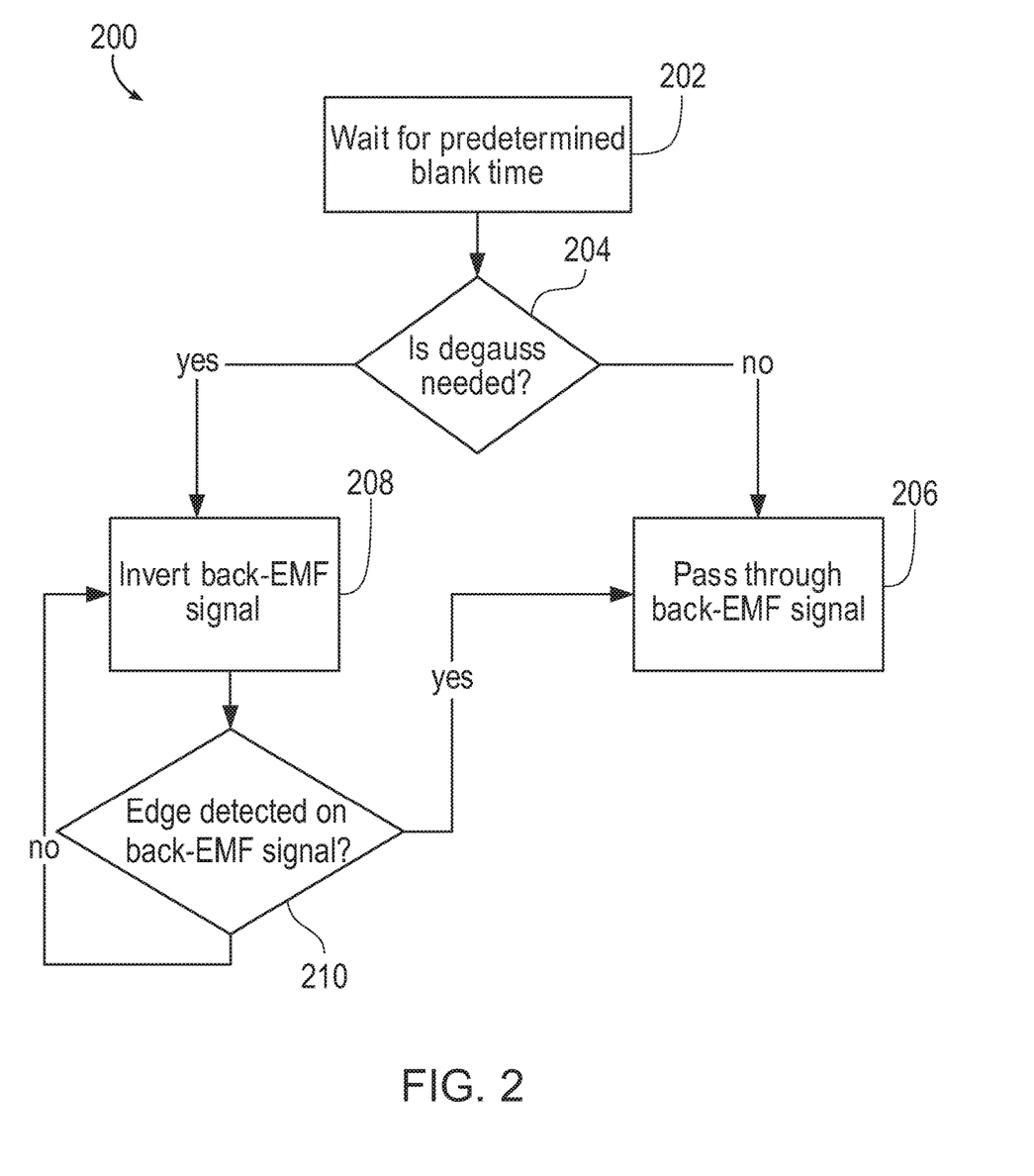
FIG. 2 is a flowchart of a method for enabling a degauss filter in a motor control circuit.

FIG. 2 is a flowchart 200 of a method for controlling degauss filter 128 in system 100. In embodiments, flowchart 200 may be implemented by processor circuit 124. The method described in flowchart 200 may be executed each time the motor 102 enters a new phase (e.g. control circuit 120 opens and closes the switches of motor driver circuit 112 (e.g. the two switches within the same phase) so that current flows through different coils of motor 102).

When comparator circuit 122 begins a new comparison of one of the coils, processor circuit 124 may wait for a predetermined "blank" time in box 202. In box 204, processor circuit 124 may determine if the degauss filter 128 is needed to filter signal 122a. The way processor circuit 124 determines if the degauss filter 128 is needed will be discussed below in relation to Table 1.

If the degauss filter is not needed, then processor circuit 124 will allow degauss filter 128 to pass signal 122a through without inverting it in box 206. However, if the degauss filter is needed, the processor circuit 124 will instruct degauss filter to 128 to invert signal 122a in box 208.

In box 210, processor circuit 124 will wait until an edge (e.g. a transition) is detected on signal 122a. When an edge is detected, processor circuit 124 will proceed to box 206 and allow degauss filter 128 to pass signal 122a through without inverting it. If an edge is not detected, processor circuit will return to box 208 and continue to check for an edge detection in box 210.

Figure 3:
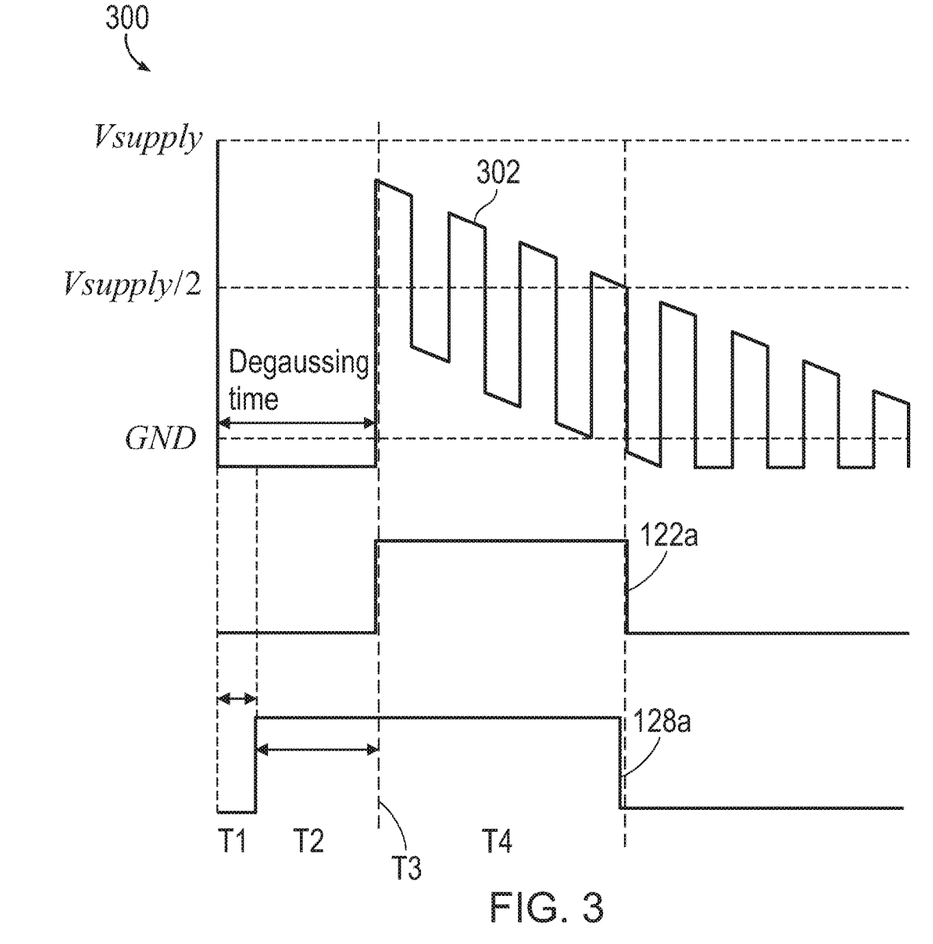
FIG. 3 is a timing diagram of signals related to the motor control circuit of FIG.

FIG. 3 is a timing diagram 300 of signals related to the motor control circuit of FIG. 1, which provides an example of how system 100 may operate. In embodiments, signal 302 represents the voltage at SA, SB or SC to ground when both switches within the same phase are opened. Signal 302 may also be similar to and may represent the input voltage to comparator circuit 122, i.e. the voltage across one of the motor coils.

Time period T1 may correspond to a blank time. During time period T1, processor circuit 124 may wait for a predetermined time as described above with respect to box 202 in FIG. 2. Time period T2 may correspond to box 208 in FIG. 2. During time period T2, degauss filter 128 may invert back-EMF signal 122a. Thus, during this time period, filtered back-EMF signal 128a may be high while back-EMF signal 122a is low. The blank time may be preset by a user, programmed during manufacturing, or may be hard coded into processor circuit 124.

During time period T2, processor circuit 124 may wait until it detects a transition edge on back-EMF signal 122a at time T3. Then during time period T4, degauss filter may pass back-EMF signal 122a through without inverting it. Time period T4 may correspond to box 206 in FIG. 2. Thus, during time period T4, both back-EMF signal 122a and filtered back-EMF signal 128a are high.

Figure 4:
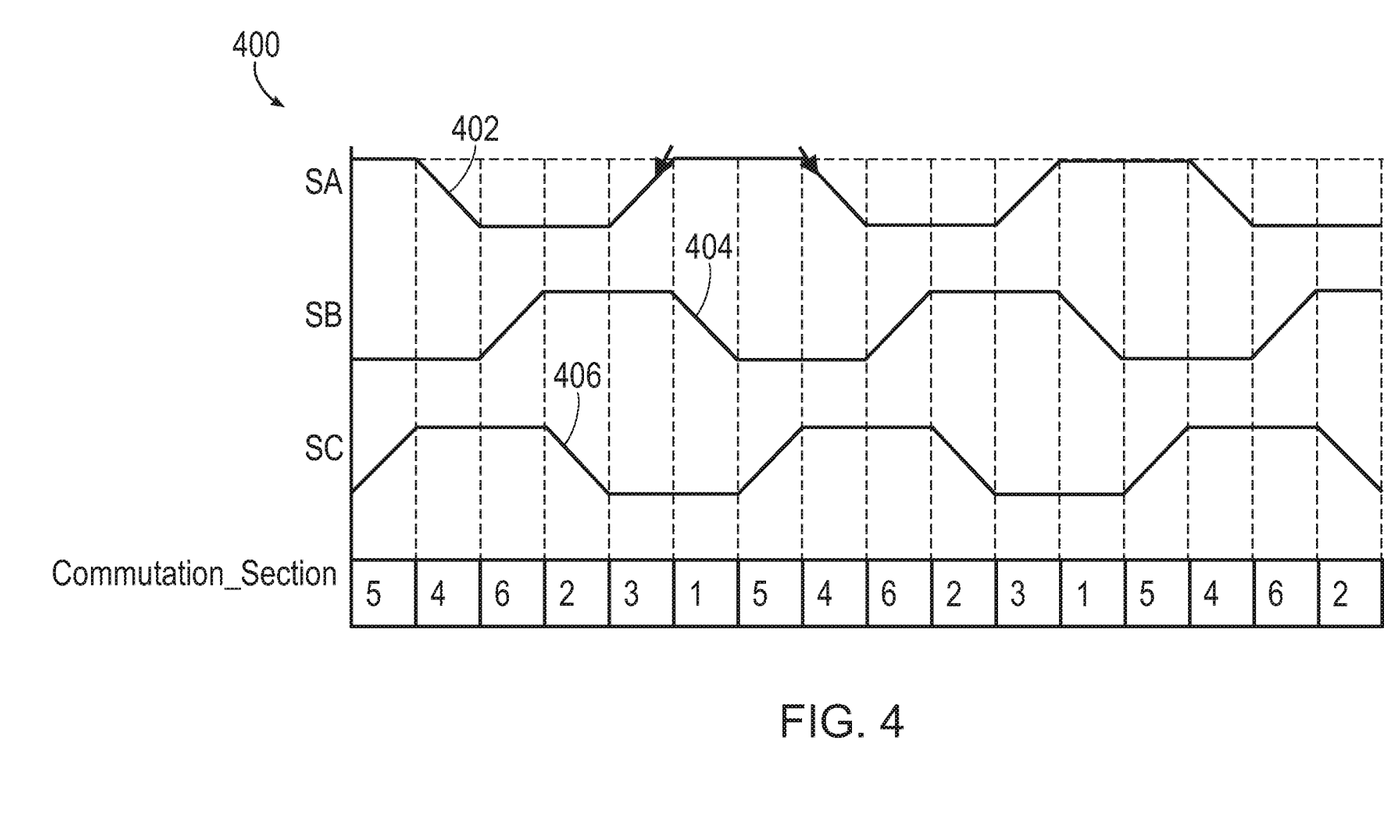
FIG. 4 is a timing diagram of signals related to the motor control circuit of FIG. 1.

FIG. 4 is a timing diagram 400 of signals related to the motor control circuit of FIG. 1. Waveform 402 represents the voltage across motor coil 104, waveform 404 represents the voltage across motor coil 106, and waveform 406 represents the voltage across motor coil 108. The numbers across the bottom of timing diagram 400 correspond to commutation numbers for controlling motor 102. Each commutation number represents a pattern of which FET switches of motor driver circuit 112 are open and closed. Thus, each commutation number represents a different current path through motor coils 104, 106, and 108.

Processor circuit 124 may use the following logic table to determine whether to activate degauss filter 128.

TABLE 1

| Row | Commutation Section | Signal 122a | Expected Signal 122a | Degauss Filter |
|---|---|---|---|---|
| 1 | 1 | High | High | No |
| 2 | 1 | Low | High | Yes |
| 3 | 2 | High | High | No |
| 4 | 2 | Low | High | Yes |
| 5 | 3 | High | Low | Yes |
| 6 | 3 | Low | Low | No |
| 7 | 4 | High | High | No |

TABLE 1-continued

| Row | Commutation Section | Signal 122a | Expected Signal 122a | Degauss Filter |
|---|---|---|---|---|
| 8 | 4 | Low | High | Yes |
| 9 | 5 | High | Low | Yes |
| 10 | 5 | Low | Low | No |
| 11 | 6 | High | Low | Yes |
| 12 | 6 | Low | Low | No |
| 13 | 0 or 7 (invalid condition) | Z | Z | No |

Table 1, or portions of table 1, may be implemented as logic circuitry within processor circuit 124. In other embodiments, table 1 or portions of table 1 may be stored as data within memory 126 and accessed by processor circuit 124.

The column labeled "Expected Signal 122a" defines an expected value for the back-EMF signal 122a under various circumstances. For example, in commutation section 1 (i.e. rows 1 and 2), signal 122a is expected to be high. The column labeled "Signal 122a" represents the measured value of back-EMF signal 122a. The column labeled "Degauss Filter" defines whether the degauss filter should invert back-EMF signal 122a or pass signal back-EMF signal 122a through without inverting it. The value "Yes" in the "Degauss Filter" column indicates signal 122a should be inverted and the value "No" indicates it should not.

As an example of how processor circuit 124 may use table 1, assume that system 100 is in commutation section 1. In this case, the value of back-EMF signal 122a should be high according to rows 1 and 2 of table 1. Thus, system 100 may compare the back-EMF signal 122a to the expected value for the back-EMF signal. If processor 124 detects that back-EMF signal 122a is high, as expected, during the degaussing time (e.g. time period Ts in FIG. 3), then processor then may determine (according to row 1 of the table) that degaussing filter 128 need not invert back-EMF signal 122a and can pass back-EMF signal 122a through without inverting it. If, on the other hand, processor circuit 124 detects that back-EMF signal 122a is low, which is not expected, then processor circuit 124 then may determine (according to row 2 of the table) that degaussing filter 128 should invert back-EMF signal 122a.

Various embodiments are described in this patent. However, the scope of the patent should not be limited to the described embodiments, but rather should be limited only by the spirit and scope of the following claims. All references cited in this patent are incorporated by reference in their entirety.

The invention claimed is:
1. A system comprising:
   a motor having a plurality of phases, each phase comprising a coil having a first end coupled to a motor neutral point;
   a motor driver circuit coupled to a second end of each coil to provide power to each coil;
   a motor controller circuit coupled to the motor driver circuit to control the power that is provided to the motor;
   a comparator directly coupled to the motor driver circuit and configured to:
   receive the power provided to each coil;
   compare a voltage at the motor neutral point to a voltage at the second end of each coil to detect a back-EMF polarity; and produce a polarity signal representing the back-EMF polarity; and
a back-EMF filter circuit configured to:
receive the polarity signal from the comparator; and
invert the polarity signal in response to the polarity signal not matching an expected value;
wherein the back-EMF filter circuit comprises:
a processor circuit configured to:
receive the polarity signal directly from the comparator; and
send a control signal in response to the polarity signal; and
a degauss filter configured to:
receive the polarity signal directly from the comparator;
receive the control signal directly from the processor circuit; and
send a signal directly to the motor control circuit in response to the control signal and the polarity signal.

2. The system of claim 1 wherein the polarity signal is a logic signal and the expected value is either a logic-high or logic-low value.

3. The system of claim 1 wherein the plurality of phases comprises exactly three phases.

4. The system of claim 1 wherein the motor driver circuit comprises a plurality of switches coupled to selectively provide power to and a return path from each coil.

5. The system of claim 4 wherein the plurality of switches are field-effect transistors.

6. The system of claim 4 wherein the motor control circuit is coupled to each of the plurality of switches and configured to open and close each of the plurality of switches to provide the power to and the return path from each coil.

7. The system of claim 1 wherein the motor controller circuit is configured to deactivate a respective coil while the comparator is comparing the voltage at the motor neutral point to the voltage at the second end of the respective coil.

8. The system of claim 1 wherein the back-EMF filter circuit is further configured to compare the polarity signal to the expected value.

9. The system of claim 1 wherein the back-EMF filter circuit comprises a network of logic gates arranged to determine if the polarity signal does not match the expected value.

10. The system of claim 1 wherein the back-EMF filter circuit is configured to determine if the polarity signal does not match the expected value after a predetermined blank time period.

11. The system of claim 1 wherein the back-EMF filter circuit is configured to stop inverting the polarity signal if a transition is detected on the polarity signal after a blank time period.

12. A circuit for driving a motor comprising:
a comparator coupled to detect a value of a voltage across a motor coil and produce a polarity signal representing a polarity of a back-EMF signal from a motor;
a back-EMF filter circuit coupled to receive the polarity signal and produce a filtered polarity signal by inverting the polarity signal if the polarity signal does not match an expected value; and
a motor controller circuit coupled to receive the filtered polarity signal and provide power to the motor coil in response to the filtered polarity signal;
wherein the back-EMF filter circuit comprises:
a processor circuit configured to:
receive the polarity signal directly from the comparator; and
send a control signal in response to the polarity signal; and
a degauss filter configured to:
receive the polarity signal directly from the comparator;
receive the control signal directly from the processor circuit; and
send a signal directly to the motor control circuit in response to the control signal and the polarity signal.

13. The circuit of claim 12 wherein the polarity signal is a logic signal and the expected value is either a logic-high or logic-low value.

14. The circuit of claim 12 further comprising a motor driver circuit comprising one or more switches to selectively provide power to and a return path from the motor coil.

15. The circuit of claim 14 wherein the one or more switches comprise field-effect transistors.

16. The circuit of claim 12 wherein the motor controller circuit is configured to deactivate the motor coil while the comparator detects the value of the voltage across the motor coil.

17. The circuit of claim 12 wherein the back-EMF filter circuit is further configured to compare the polarity signal to the expected value.

18. The circuit of claim 12 wherein the back-EMF filter circuit comprises a network of logic gates arranged to determine if the polarity signal does not match the expected value.

19. The circuit of claim 12 wherein the back-EMF filter circuit is configured to determine if the polarity signal does not match the expected value after a predetermined blank time period.

20. The circuit of claim 12 wherein the back-EMF filter circuit is configured to stop inverting the polarity signal if a transition is detected on the polarity signal after a blank time period.

21. A system comprising:
a motor having a plurality of phases, each phase comprising a coil having a first end coupled to a motor neutral point;
a motor driver circuit connected to a second end of each coil and configured to provide power to each coil;
a motor controller circuit connected to the motor driver circuit and configured to control the power that is provided to the motor;
a comparator configured to:
compare a voltage at the motor neutral point to a voltage at the second end of each coil to detect a back-EMF polarity; and
produce a polarity signal representing the back-EMF polarity; and a back-EMF filter circuit directly connected to the comparator and configured to:
receive the polarity signal directly from the comparator; and
invert the polarity signal in response to the polarity signal not matching an expected value;
wherein the back-EMF filter circuit comprises:
a processor circuit configured to:
receive the polarity signal directly from the comparator; and
send a control signal in response to the polarity signal; and
a degauss filter configured to:
receive the polarity signal directly from the comparator;
receive the control signal directly from the processor circuit; and
send a signal directly to the motor control circuit in response to the control signal and the polarity signal.

22. The system of claim 21, wherein the polarity signal is a logic signal, and
wherein the expected value is either a logic-high or logic-low value.

23. The system of claim 21, wherein the plurality of phases comprises exactly three phases.

24. The system of claim 21, wherein the motor driver circuit comprises a plurality of switches coupled to selectively provide power to and a return path from each coil.

25. The system of claim 24, wherein the plurality of switches are field-effect transistors.

26. The system of claim 24, wherein the motor control circuit is connected to each of the plurality of switches and configured to open and close each of the plurality of switches to provide the power to and the return path from each coil.

27. The system of claim 21, wherein the motor controller circuit is configured to deactivate a respective coil while the comparator is comparing the voltage at the motor neutral point to the voltage at the second end of the respective coil.

28. The system of claim 21, wherein the back-EMF filter circuit is further configured to compare the polarity signal to the expected value.

29. The system of claim 21, wherein the back-EMF filter circuit comprises a network of logic gates arranged to determine in response to the polarity signal not matching the expected value.

30. The system of claim 21, wherein the back-EMF filter circuit is configured to determine in response to the polarity signal not matching the expected value after a predetermined blank time period.

31. The system of claim 21, wherein the back-EMF filter circuit is configured to stop inverting the polarity signal in response to a transition being detected on the polarity signal after a blank time period.

* * * * *

UNITED STATES PATENT AND TRADEMARK OFFICE
CERTIFICATE OF CORRECTION

PATENT NO. : 11,374,513 B2  
APPLICATION NO. : 16/255088  
DATED : June 28, 2022  
INVENTOR(S) : Kamyar Khosravi et al.

Page 1 of 1

It is certified that error appears in the above-identified patent and that said Letters Patent is hereby corrected as shown below:

In the Specification

Column 1, Line 22, delete "that has" and replace with --has--.

Column 3, Line 4, delete "FIG." and replace with --FIG. 1.--.

Column 3, Line 20, delete "switch" and replace with --switches--.

Column 4, Line 18, delete "from motor" and replace with --from the motor--.

Column 4, Line 22, delete "forces it" and replace with --forces is--.

Column 5, Line 9, delete "filter is" and replace with --filter 128 is--.

Column 5, Line 10, delete "filter to 128" and replace with --filter 128--.

Column 5, Line 16, delete "circuit will" and replace with --circuit 124 will--.

Column 5, Line 38, delete "filter may" and replace with --filter 128 may--.

Column 6, Line 24, delete "or pass signal" and replace with --or pass--.

Column 6, Line 35, delete "Ts" and replace with --T3--.

Column 6, Lines 36-37, delete "then processor then may" and replace with --then processor 124 may--.

Column 6, Line 42, delete "124 then may" and replace with --124 may--.

Signed and Sealed this  
Fifteenth Day of August, 2023

Katherine Kelly Vidal  
*Director of the United States Patent and Trademark Office*